US012648155B2

(12) United States Patent
Chae et al.

(10) Patent No.: US 12,648,155 B2
(45) Date of Patent: Jun. 2, 2026

(54) SEMICONDUCTOR DEVICES WITH HYBRID BONDING LAYERS AND PROCESS OF MAKING THE SAME

(71) Applicant: Tokyo Electron Limited, Tokyo (JP)

(72) Inventors: Soo Doo Chae, Albany, NY (US); Matthew Baron, Albany, NY (US); Adam Gildea, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 472 days.

(21) Appl. No.: 18/309,678

(22) Filed: Apr. 28, 2023

(65) Prior Publication Data

US 2024/0363564 A1 Oct. 31, 2024

(51) Int. Cl.
*H01L 23/00* (2006.01)
*H01L 25/065* (2023.01)
*H10B 80/00* (2026.01)

(52) U.S. Cl.
CPC ............. *H01L 24/06* (2013.01); *H01L 24/03* (2013.01); *H01L 24/05* (2013.01); *H01L 24/08* (2013.01); *H01L 24/80* (2013.01); *H01L 25/0657* (2013.01); *H10B 80/00* (2023.02); *H01L 2224/03616* (2013.01); *H01L 2224/0362* (2013.01); *H01L 2224/05647* (2013.01); *H01L 2224/05687* (2013.01); *H01L 2224/06505* (2013.01); *H01L 2224/08146* (2013.01); *H01L 2224/80895* (2013.01); *H01L 2224/80896* (2013.01); *H01L 2225/06527* (2013.01); *H01L 2225/06544* (2013.01); *H01L 2225/06565* (2013.01); *H01L 2924/1431* (2013.01); *H01L 2924/1434* (2013.01)

(58) Field of Classification Search
CPC ......... H01L 24/06; H01L 24/05; H01L 24/08; H01L 24/80; H01L 2224/06505; H01L 2224/08146; H01L 2224/80895; H01L 2224/80896
See application file for complete search history.

(56) References Cited

U.S. PATENT DOCUMENTS

| | | | | |
|---|---|---|---|---|
| 7,812,459 | B2 * | 10/2010 | Yu | ....................... H01L 25/0652 257/E21.511 |
| 2016/0190103 | A1 * | 6/2016 | Kabe | .................... H01L 23/564 257/777 |
| 2020/0373235 | A1 | 11/2020 | Collins et al. | |
| 2021/0335726 | A1 | 10/2021 | Wu et al. | |

(Continued)

FOREIGN PATENT DOCUMENTS

KR 1020230046934 A 4/2023

OTHER PUBLICATIONS

International Search Report and Written Opinion dated Jun. 27, 2024 on PCT App. PCT/US2024/016072 (9 pages).

*Primary Examiner* — Mamadou L Diallo
(74) *Attorney, Agent, or Firm* — Foley & Lardner LLP

(57) ABSTRACT

At least one aspect of the present disclosure is directed to a semiconductor device. The semiconductor device includes a first substrate including a first area and a second area; a second substrate including a third area and a fourth area; a first bonding layer comprising a first dielectric material that bonds the first area to the third area; and a second bonding layer comprising a second dielectric material that bonds the second area to the fourth area. The first dielectric material is different from the second dielectric material.

20 Claims, 9 Drawing Sheets

(56)     References Cited

U.S. PATENT DOCUMENTS

| 2022/0051985 | A1  | 2/2022  | Agarwal et al. |
|---|---|---|---|
| 2022/0093561 | A1* | 3/2022  | Eid ..................... H01L 23/5386 |
| 2023/0062465 | A1  | 3/2023  | Clark |
| 2023/0352367 | A1* | 11/2023 | Yu ........................ H01L 23/4334 |
| 2023/0411326 | A1* | 12/2023 | Tsai ........................ H01L 25/50 |
| 2024/0006272 | A1* | 1/2024  | Kim .................. H01L 23/49838 |

* cited by examiner

100

102 — Cover 1st substrate with 1st dielectric material

104 — Cover 1st area of the 1st substrate with the 1st dielectric material

106 — Cover both 1st and 2nd areas of the 1st substrate with 2nd dielectric material 108 — Form recesses across the 1st and 2nd areas 110 — Fill the recesses with metal material 112 — Polish the 1st substrate 114 — Provide 2nd substrate 116 — Bond the 1st substrate to the 2nd substrate 1102 — Cover 1st substrate with 1st dielectric material 1104 — Cover 1st area of the 1st substrate with the 1st dielectric material 1106 — Cover both 1st and 2nd areas of the 1st substrate with 2nd dielectric material 1108 — Polish the 1st substrate 1110 — Fill recesses with metal material 1112 — Polish the 1st substrate 1114 — Provide 2nd substrate 1116 — Bond the 1st substrate to the 2nd substrate

SEMICONDUCTOR DEVICES WITH HYBRID BONDING LAYERS AND PROCESS OF MAKING THE SAME

FIELD OF THE DISCLOSURE

This disclosure relates to semiconductor devices and methods of bonding a plural number of semiconductor substrates.

BACKGROUND

Typically, in a semiconductor device, various electronic components (e.g., transistors, diodes, resistors, capacitors, and the like) are formed on a semiconductor wafer. These semiconductor wafers (or one or more their respective device dies) may then be bonded to each other to form functional devices. These semiconductor wafers (or device dies) may be bonded together (e.g., stacked on top of one another) using any of various bonding techniques to form a functional device.

SUMMARY

At least one aspect of the present disclosure is directed to a semiconductor device. The semiconductor device includes a first substrate including a first area and a second area; a second substrate including a third area and a fourth area; a first bonding layer comprising a first dielectric material that bonds the first area to the third area; and a second bonding layer comprising a second dielectric material that bonds the second area to the fourth area. The first dielectric material is different from the second dielectric material.

In some embodiments, the first substrate comprises a first dielectric layer disposed on the first substrate; a first interconnect structure extending through the first bonding layer and into the first dielectric layer, and having a first upper surface not overlaid by the first bonding layer; and a second interconnect structure extending through the second bonding layer and into the first dielectric layer, and having a second upper surface not overlaid by the second bonding layer.

In some embodiments, the second substrate comprises a second dielectric layer disposed on the second substrate; a third interconnect structure extending through the first bonding layer and into the second dielectric layer, and having a third upper surface not overlaid by the first bonding layer; and a fourth interconnect structure extending through the second bonding layer and into the second dielectric layer, and having a fourth upper surface not overlaid by the second bonding layer.

In some embodiments, the first interconnect structure contacts the third interconnect structure, with the first upper surface and the third upper surface in contact with each other, and the second interconnect structure contacts the fourth interconnect structure, with the second upper surface and the fourth upper surface in contact with each other. The first bonding layer is around a portion of a collective sidewall of the contacted first and third interconnect structures. The second bonding layer is around a portion of a collective sidewall of the contacted second and fourth interconnect structures.

In some embodiments, the first substrate includes a plurality of first logic devices in the first area and a plurality of first memory cells in the second area, respectively. The second substrate includes a plurality of second logic devices in the third area and a plurality of second memory cells in the fourth area, respectively. The first interconnect structure is electrically coupled to at least one of the plurality of first logic devices, and the third interconnect structure is electrically coupled to at least one of the plurality of second logic devices. The second interconnect structure is not electrically coupled to any of the plurality of first memory cells, and the fourth interconnect structure is not electrically coupled to any of the plurality of second memory cells.

In some embodiments, the first dielectric material includes silicon carbonitride, and the second dielectric material includes a high-k dielectric.

In some embodiments, the first dielectric material includes silicon carbonitride, and the second dielectric material includes silicon oxide.

At least another aspect of the present disclosure is directed to a semiconductor device. The semiconductor device includes a first substrate including a first interconnect structure and a second interconnect structure in a first area and a second area, respectively; a second substrate including a third interconnect structure and a fourth interconnect structure in a third area and a fourth area, respectively, wherein the first interconnect structure is in contact with the third interconnect structure and the second interconnect structure is in contact with the fourth interconnect structure; a first bonding layer comprising a first dielectric material that bonds the first area to the third area; and a second bonding layer comprising a second dielectric material that bonds the second area to the fourth area. The first dielectric material is different from the second dielectric material.

In some embodiments, the first dielectric material includes silicon carbonitride, and the second dielectric material includes a high-k dielectric.

In some embodiments, the first dielectric material includes silicon carbonitride, and the second dielectric material includes silicon oxide.

In some embodiments, the first substrate includes a plurality of first logic devices in the first area and a plurality of first memory cells in the second area, respectively, and the second substrate includes a plurality of second logic devices in the third area and a plurality of second memory cells in the fourth area, respectively.

In some embodiments, the first interconnect structure is electrically coupled to at least one of the plurality of first logic devices, and the third interconnect structure is electrically coupled to at least one of the plurality of second logic devices, and wherein the second interconnect structure is not electrically coupled to any of the plurality of first memory cells, and the fourth interconnect structure is not electrically coupled to any of the plurality of second memory cells.

Yet another aspect of the present disclosure may be directed to a method for fabricating semiconductor devices. The method includes providing a first substrate including a first dielectric layer; overlaying a first area and a second area of the first dielectric layer with a first bonding layer that includes a first dielectric material and a second bonding layer that includes a second dielectric material, respectively; providing a second substrate including a second dielectric layer; overlaying a third area and a fourth area of the second dielectric layer with a third bonding layer that includes the first dielectric material and a fourth bonding layer that includes the second dielectric material, respectively; and bonding the first substrate to the second substrate through the first to fourth bonding layers, with the first area coupled to the third area and the second area coupled to the fourth area, respectively. The first dielectric material is different from the second dielectric material.

In some embodiments, the first dielectric material includes silicon carbonitride, and the second dielectric material includes a high-k dielectric or silicon oxide.

In some embodiments, the method further includes forming, in the first area, a first interconnect structure extending through the first bonding layer and into the first dielectric layer; forming, in the second area, a second interconnect structure extending through the second bonding layer and into the first dielectric layer; forming, in the third area, a third interconnect structure extending through the third bonding layer and into the second dielectric layer; and forming, in the fourth area, a fourth interconnect structure extending through the fourth bonding layer and into the second dielectric layer. After the step of bonding the first substrate to the second substrate, the first interconnect structure is in contact with the third interconnect structure and the second interconnect structure is in contact with the fourth interconnect structure, respectively.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
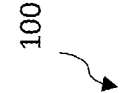
FIG. 1 illustrates a flowchart of a method to form a semiconductor device with hybrid bonding layers, according to various embodiments.
Figure 1:
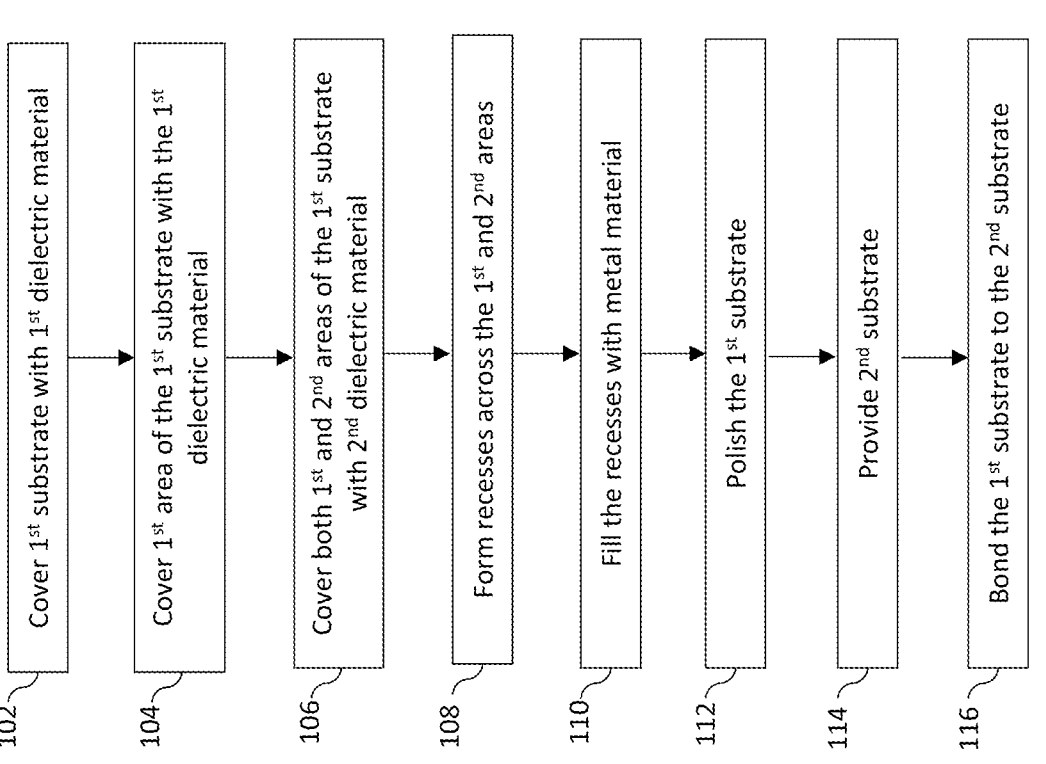

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Wafer-to-wafer and chip-to-chip bonding is being implemented to continue Power-Performance-Area-Cost (PPAC) scaling for complex circuits, such as implementations in Systems on Chip (SoCs). Many bonding techniques utilize dielectric-to-dielectric bonding adhesion and form integrated interconnect structures through a hybrid bonding technique that enables interconnections to be formed at the bond interface between two wafers or dies. Current technologies typically use a unified dielectric material as a bonding layer for each of the wafers. With each of the to-be-bonded wafers uniformed covered by a single bonding layer, some trade-off may sometimes be required. For example, a bonding layer having silicon carbonitride (SiCN) is typically used for blocking copper migration, but SiCN may be associated with relatively weak bonding strength. In another example, a bonding layer having silicon oxide ($SiO_2$) and/or a high-k dielectric material may show high bonding strength, but such a material is typically associated with copper diffusion issues and/or high RC delay. Thus, the existing technologies to integrate wafers using hybrid-bonding techniques have not been entirely satisfactory in many aspects.

The present disclosure provides various embodiments of a semiconductor device having at least first and second semiconductor wafers (or substrates) bonded to each other with one or more hybrid bonding layers, and methods for forming the same. In some embodiments, each of the first semiconductor wafer and second semiconductor wafer may have a first area and a second area that are configured to form different functional circuits, respectively. The first and second areas may be laterally arranged with respect to each other. In a non-limiting example, the first area can be configured to form a number of logic devices (e.g., transistors, etc.); and the second area can be configured to form a number of memory cells (e.g., NAND memory cells, NOR memory cells, etc.). Given the nature of such different functionalities, a "hybrid" bonding layer may have a first dielectric material and a second dielectric material covering the first (logic) area and the second (memory) area of each of the first and second wafers, respectively, in accordance with various embodiments of the present disclosure. The first dielectric material (for the logic area), e.g., SiCN, may be directed to providing low RC delay and preventing copper diffusion, while the second dielectric material (for the memory area), e.g., $SiO_2$ and/or high-k dielectric materials, may be directed to provide high bonding strength. As such, the disclosed semiconductor device can have firmly bonded different wafers, while being free from the issues identified above.

FIG. 1 illustrates a flowchart of a method 100 for forming a semiconductor device (e.g., package) having at least two coupled (e.g., bonded) wafers, dies, or substrates based on two hybrid bonding layers originally formed over the two substrates. It is noted that the method 100 is merely an example, and is not intended to limit the present disclosure. Accordingly, it is understood that additional operations may be provided before, during, and after the method 100 of FIG. 1, and that some other operations may only be briefly described herein.

Figure 2:
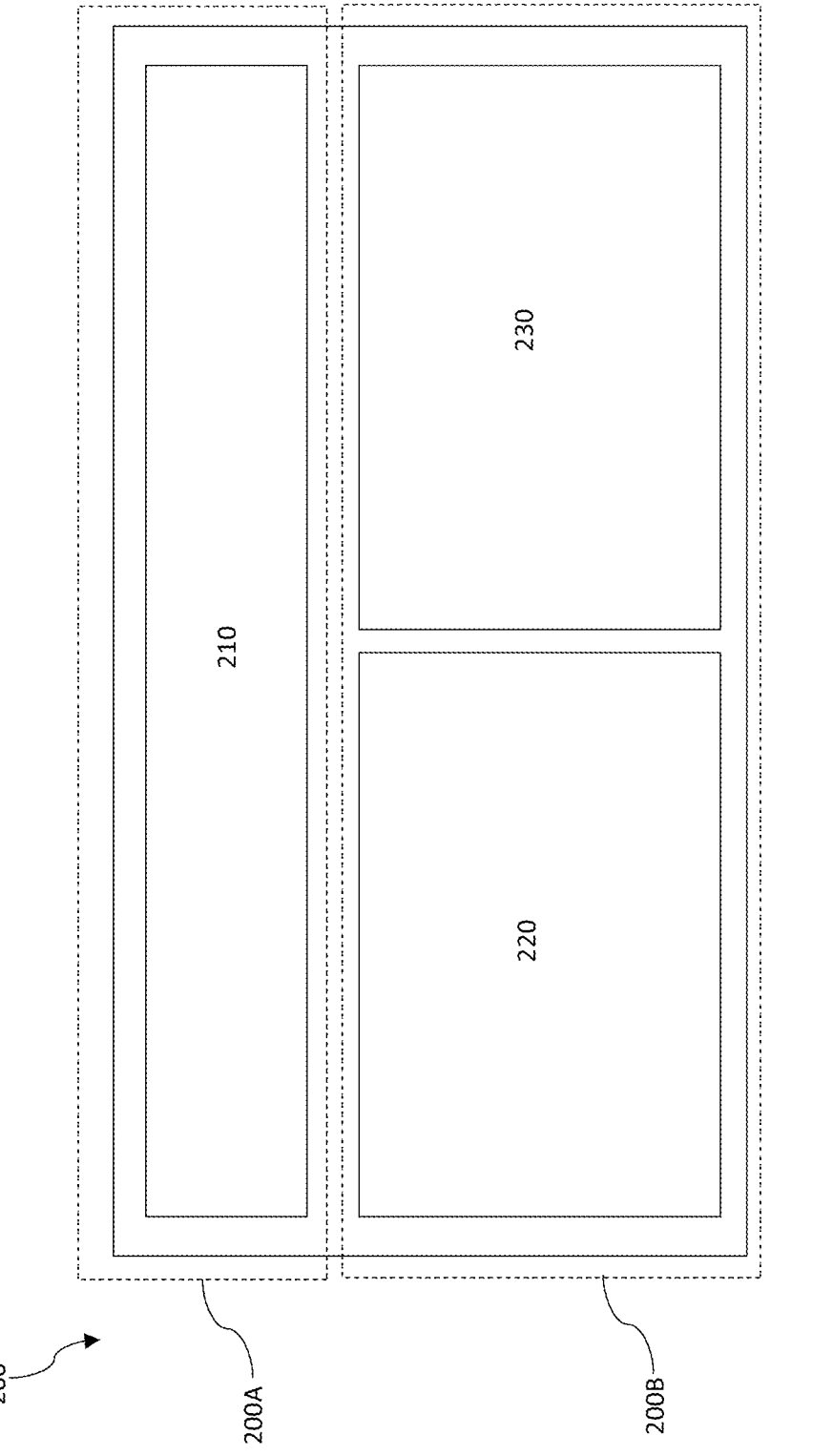
FIG. 2 illustrates an example top view of a semiconductor substrate that may be implemented in the method of FIG. 1, according to various embodiments.

In various embodiments, each of the to-be-bonded substrates has at least a first area and a second area that configured as real estate for a number of logic devices and a number of memory cells, respectively. FIG. 2 illustrates an example top view (or layout view) of such first and second areas laterally arranged on a substrate 200. As shown, the substrate 200 include a first area 200A and a second area 200B. In the first area 200A, a number of logic devices (e.g., transistors) 210 are formed; and in the second area 200B, a number of memory arrays, 220 and 230, are formed. In some embodiments, the logic devices 210 and the memory arrays 220-230 can be operatively coupled to each other through BUS, which may transmit and/or receive data based on an interface such as, for example, a single data rate (SDR) interface, a toggle double data rate (DDR) interface, an open NAND flash interface (ONFI), among others.

For example, the logic devices 210 can operatively serve as at least one of: an I/O circuit, a logic control circuit, a command register (circuit), an address register (circuit), a sequencer (circuit), a row decoder (circuit), or a sensing amplifier (circuit). The memory arrays 220-230 can each include a plural number of memory cells, each of the memory cells is configured to store data. For example, the memory arrays 220-230 may each include a dynamic random-access memory (DRAM) array, a static random-access memory (SRAM) array, a resistive random-access memory (RRAM) array, a magnetoresistive random access memory (MRAM) array, a phase change random access memory (PCRAM) array, etc.

Further, operations of the method 100 may be associated with cross-sectional views of an example semiconductor device 300 at various fabrication stages as shown in FIGS. 3 to 10, respectively, which will be discussed in further detail below. The semiconductor device 300 includes at least two substrates, each of which may be an implementation of the substrate 200 that includes a first area and a second area configured to house logic devices and memory cells, respectively, as shown in FIG. 2. It should be understood that the semiconductor device 300, shown in FIGS. 3 to 10, may include a number of other devices such as inductors, fuses, capacitors, coils, etc., while remaining within the scope of the present disclosure.

Figures 3, 4, 5:
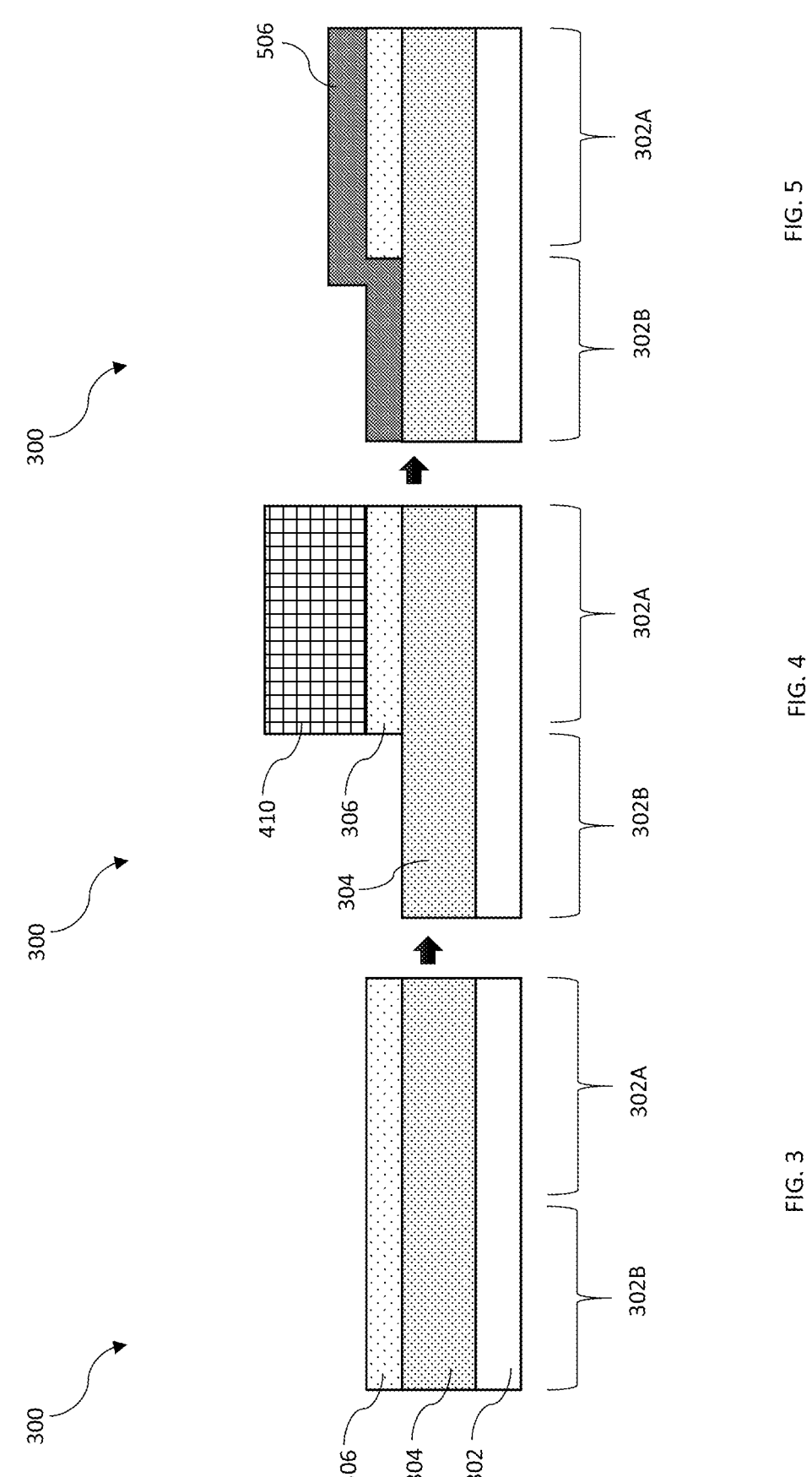
FIGS. 3-10 show cross-sectional views of a device during various fabrication stages of the method of FIG. 1, according to various embodiments.

Corresponding to operation 102 of FIG. 1, FIG. 3 is a cross-sectional view of the semiconductor device 300 in which a first substrate 302 is covered by a first dielectric material 306 at one of the various stages of fabrication, in accordance with various embodiments of the present disclosure.

The first substrate 302 may be a semiconductor substrate, such as a bulk semiconductor, a semiconductor-on-insulator (SOI) substrate, or the like, which may be doped (e.g., with a p-type or an n-type dopant) or undoped. In some embodiments, the first substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. For example, the semiconductor material of the first substrate 302 may include silicon; a compound semiconductor including silicon carbide, gallium arsenic, gallium phosphide, indium phosphide, indium arsenide, and/or indium antimonide; an alloy semiconductor including, GaAsP, AlInAs, AlGaAs, GaInAs, GaInP, and/or GaInAsP; or combinations thereof.

As noted above, the first substrate 302 includes a first area 302A and a second area 302B that are configured to form logic devices (not shown) and memory cells (not shown), respectively. In various embodiments, a number of inter-metal dielectric (IMD) materials 304 are formed over the logic devices and memory cells, i.e., over both the first area 302A and second area 302B. A number of interconnect structures can be formed in the IMD material 304 where the IMD material 304 is configured to electrically isolate neighboring ones of the interconnect structures, which will be discussed below. The IMD material 304 can be formed of one or more dielectric materials such as, for example, $SiO_2$. Over the IMD material 304, the first dielectric material 306 is formed. At the current fabrication stage, the first dielectric material 306 may be formed over both the first area 302A and second area 302B. In various embodiments, the first dielectric material 306 may include SiCN or other suitable materials that can be used to mitigate copper diffusion (when forming interconnect structures) and/or lower RC delay (between neighboring interconnect structures).

Corresponding to operation 104 of FIG. 1, FIG. 4 is a cross-sectional view of the semiconductor device 300 in which the first dielectric material 306 is patterned to cover only the first area 302A at one of the various stages of fabrication, in accordance with various embodiments of the present disclosure.

In various embodiments, the first dielectric material 306 is patterned using lithography. For example, a patternable layer (e.g., a photoresist layer) 410 is formed over the first area 302A of the first dielectric material 306, followed by an etching process to remove the uncovered portion of the first dielectric material 306 (i.e., the first dielectric material 306 the second area 302B). Consequently, a portion of the IMD material 304 in the second area 302B can be exposed, as shown in FIG. 4.

Corresponding to operation 106 of FIG. 1, FIG. 5 is a cross-sectional view of the semiconductor device 300 in which a second dielectric material 506 is formed to cover both the first area 302A and second area 302B at one of the various stages of fabrication, in accordance with various embodiments of the present disclosure.

Upon the portion of the IMD material 304 in the second area 302B being exposed, the second dielectric material 506 is formed to universally cover both the first area 302A and second area 302B. In various embodiments, the second dielectric material 506 may be different from the first dielectric material 306. The second dielectric material 506 may be configured to provide strong bonding strength with another substrate, while the first dielectric material 306 may be configured to mitigate copper diffusion and/or reduce RC delay. For example, the second dielectric material 506 may include $SiO_2$ and/or high-k dielectric materials.

Figures 6, 7, 8:
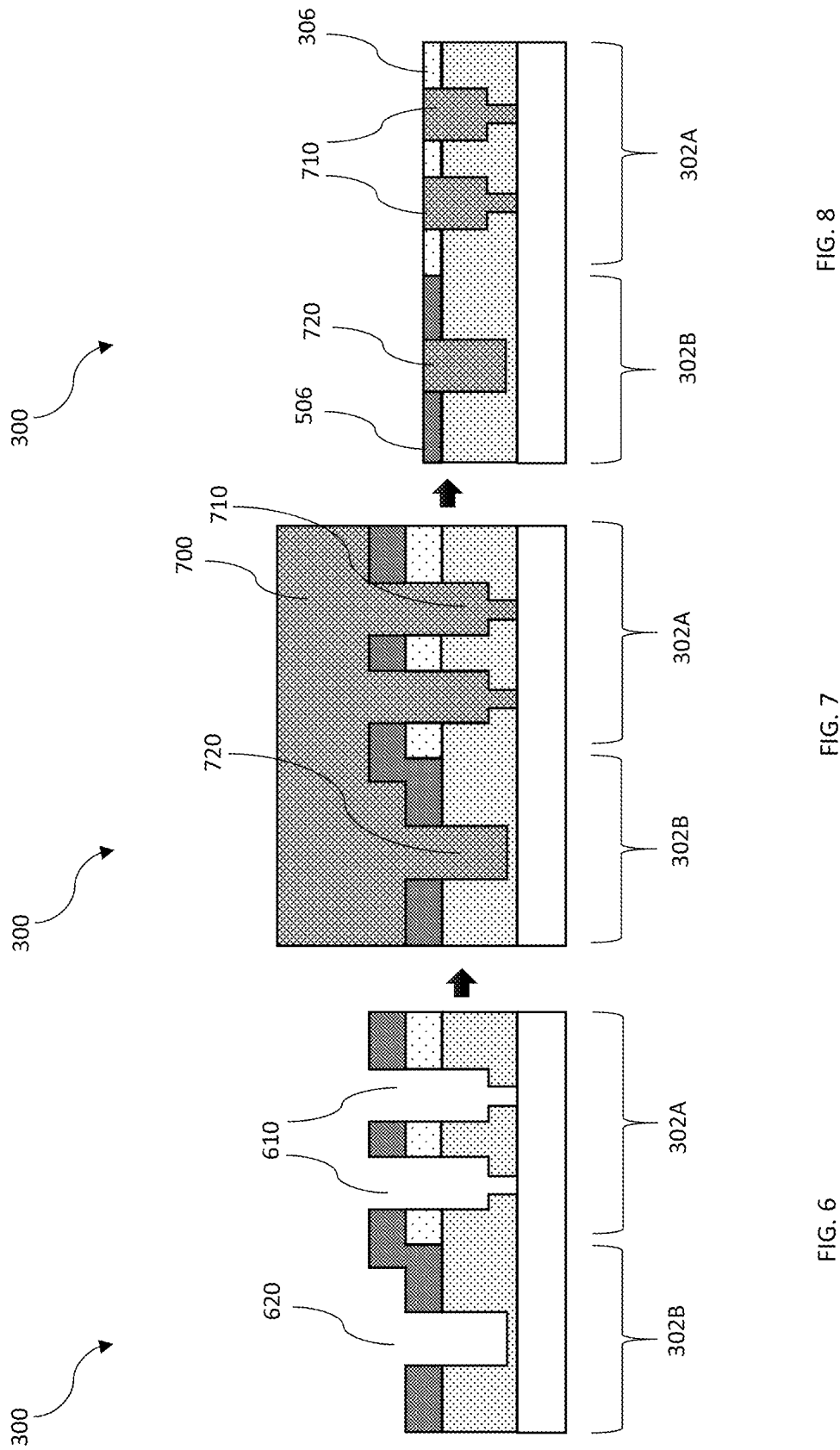

Corresponding to operation 108 of FIG. 1, FIG. 6 is a cross-sectional view of the semiconductor device 300 in which a number of first recesses 610 and a number of second recesses 620 are formed at one of the various stages of fabrication, in accordance with various embodiments of the present disclosure.

As shown, the first recesses 610 are formed in the IMD material 304, the first dielectric material 306, and the second dielectric material 506; and the second recesses 620 are formed in the IMD material 304 and the second dielectric material 506. In various embodiments, the first recesses 610 may extend through the second dielectric material 506, the first dielectric material 306, and the IMD material 304 to reach (e.g., be in electrical contact with) the logic devices formed in the first area 302A. On the other hand, the second recesses 620 may extend through the second dielectric material 506 and the IMD material 304, which may not necessarily reach (e.g., be in electrical contact with) the memory cells formed in the second area 302B.

Corresponding to operation 110 of FIG. 1, FIG. 7 is a cross-sectional view of the semiconductor device 300 in which a metal material 700 is formed to fill the first recesses 610 and second recesses 620 at one of the various stages of fabrication, in accordance with various embodiments of the present disclosure.

By filling the first recesses 610 and second recesses 620 with the metal material 710, a number of interconnect structures can be formed. For example, a number of first interconnect structures 710 can be formed in the first area 302A, and a number of second interconnect structures 720 can be formed in the second area 302B. The first interconnect structures 710 may be connected to the logic devices formed in the first area 302A, while the second interconnect structures 720 may not be necessarily connected to the memory cells formed in the second area 302B. The metal material 700 may include at least one of Cu, Al, W, Ti, TiN, Ta, TaN, or combinations thereof.

Corresponding to operation 112 of FIG. 1, FIG. 8 is a cross-sectional view of the semiconductor device 300 in which a polishing process is performed on the workpiece at one of the various stages of fabrication, in accordance with various embodiments of the present disclosure.

After filling the first and second recesses with the metal material 700, a chemical mechanical polishing (CMP) process is performed to remove at least the excessive metal material 700 and a portion of the second dielectric material 506 disposed in the first area 302A until a coplanar surface, which is shared by the first interconnect structures 710, the first dielectric material 306, the second interconnect structures 720, and the second dielectric material 506, is formed. As a result, a first bonding layer, having a top surface shared by a mixture of polished surfaces of the first interconnect structures 710 and the first dielectric material 306, can be formed in the first area 302A, and a second bonding layer, having a top surface shared by a mixture of polished surfaces of the second interconnect structures 720 and the second dielectric material 506, can be formed in the second area 302B, according to various embodiments of the present disclosure. The first bonding layer, formed in the first area 302A of the first substrate 302, may at least include the first dielectric material 306; and the second bonding layer, formed in the second area 302B of the first substrate 302, may at least include the second dielectric material 506.

Figures 9, 10:
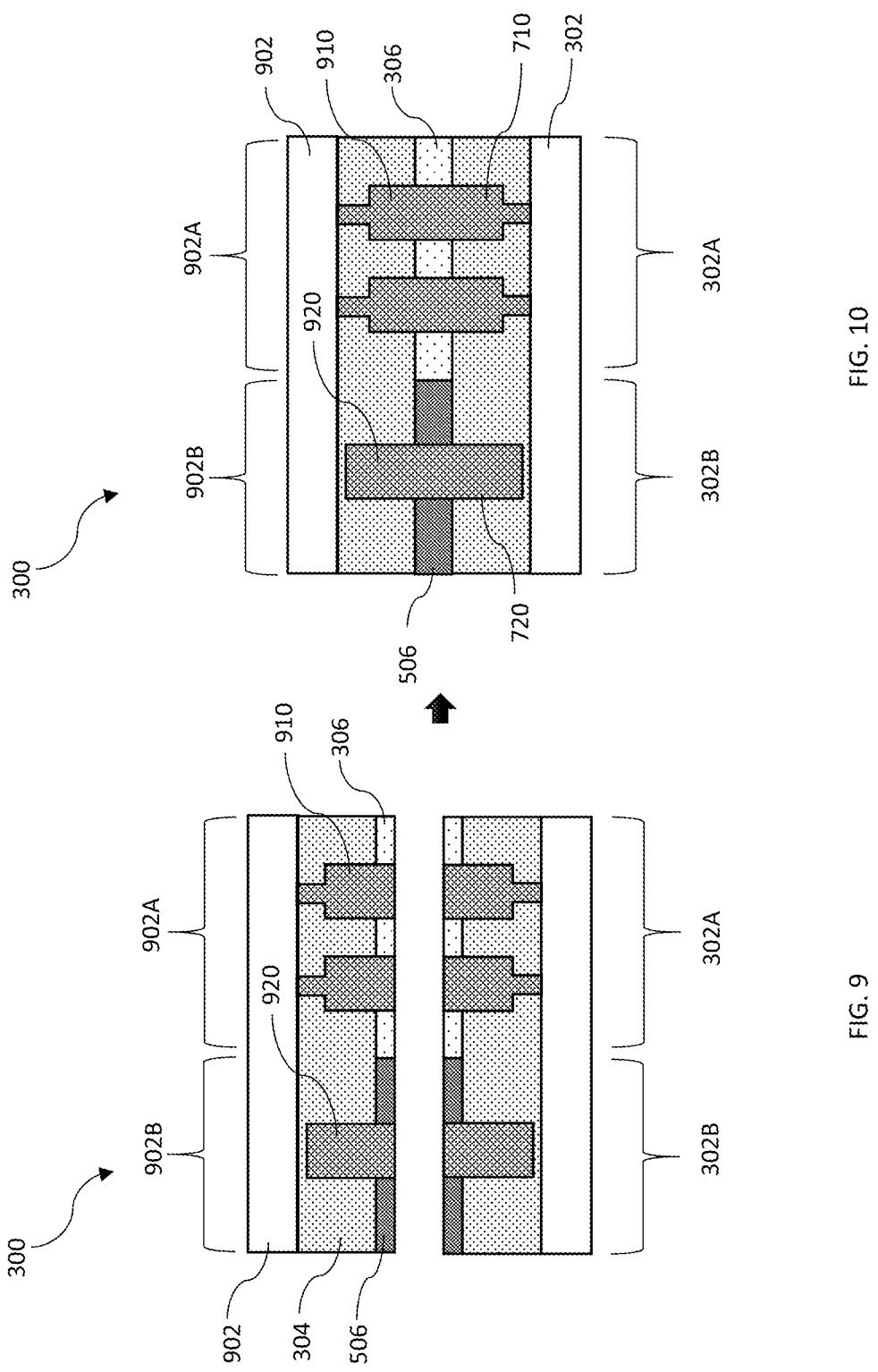

Corresponding to operation 114 of FIG. 1, FIG. 9 is a cross-sectional view of the semiconductor device 300 in which a second substrate 902 is provided at one of the various stages of fabrication, in accordance with various embodiments of the present disclosure.

The second substrate 902 may be prepared similarly to the first substrate 302, according to operations 102 to 112 of the method 100 (FIG. 1). As such, the second substrate 902 may also include a first area 902A and a second area 902B. In the first area 902A, a number of first interconnect structures 910 are formed to extend through the IMD material 304 and the first dielectric material 306; and, in the second area 902B, a number of second interconnect structures 920 are formed to extend through the IMD material 304 and the second dielectric material 506. In other words, the second substrate 902 may also include a first bonding layer, having a top surface shared by a mixture of polished surfaces of the first interconnect structures 910 and the first dielectric material 306, in the first area 902A, and a second bonding layer, having a top surface shared by a mixture of polished surfaces of the second interconnect structures 920 and the second dielectric material 506, in the second area 302B, according to various embodiments of the present disclosure. The first bonding layer, formed in the first area 902A of the second substrate 902, may at least include the first dielectric material 306; and the second bonding layer, formed in the second area 902B of the second substrate 902, may at least include the second dielectric material 506.

Corresponding to operation 116 of FIG. 1, FIG. 10 is a cross-sectional view of the semiconductor device 300 in which the first substrate 302 and the second substrate 902 are bonded to each other through the respective first bonding layers and second bonding layers at one of the various stages of fabrication, in accordance with various embodiments of the present disclosure.

In various embodiments, the first substrate 302 and the second substrate 902 are bonded together using a hybrid bonding process by coupling a top surface of the first bonding layer of the first substrate 302 to a top surface of the first bonding layer of the second substrate 902, and by coupling a top surface of the second bonding layer of the first substrate 302 to a top surface of the second bonding layer of the second substrate 902. As such, the respective first areas 302A and 902A may be bonded to each other through the first bonding layers (essentially comprised of the first dielectric material 306), and the respective second areas 302B and 902B may be bonded to each other through the second bonding layers (essentially comprised of the second dielectric material 506). For example, the first interconnect structures 710 of the first semiconductor substrate 302 are aligned with the first interconnect structures 910 of the second semiconductor substrate 902, and the second interconnect structures 720 of the first semiconductor substrate 302 are aligned with the second interconnect structures 920 of the second semiconductor substrate 902. The alignment of the first and second semiconductor substrates 302 and 902 may be achieved using optical sensing, as an example.

After the alignment process, the first and second semiconductor substrates, 302 and 902, are hybrid bonded together by applying pressure and heat. The term "hybrid" refers to the formation of at least two different types of bonds using a single bonding process, rather than forming only one type of the bonds, as is the practice in other types of wafer-to-wafer or die-to-die bonding processes, for example. As illustrated in the example of FIG. 10, a first type of bonds may be present between the first interconnect structures 710 and 910, and between the second interconnect structures 720 and 920; a second type of bonds may be present between the respective first dielectric materials 306 of the first and second substrates; and a third type of bonds may be present between the respective second dielectric materials 506 of the first and second substrates. Consequently, a (e.g., central) portion of collective sidewalls of the bonded first interconnect structures 710 and 910 may be surrounded by the first bonding layer (formed at least of the first dielectric material 306); and a (e.g., central) portion of collective sidewalls of the bonded first interconnect structures 720 and 920 may be surrounded by the second bonding layer (formed at least of the second dielectric material 506).

Figure 11:
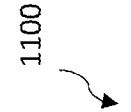
FIG. 11 illustrates a flowchart of a method to form a semiconductor device with hybrid bonding layers, according to various embodiments.
Figure 11:
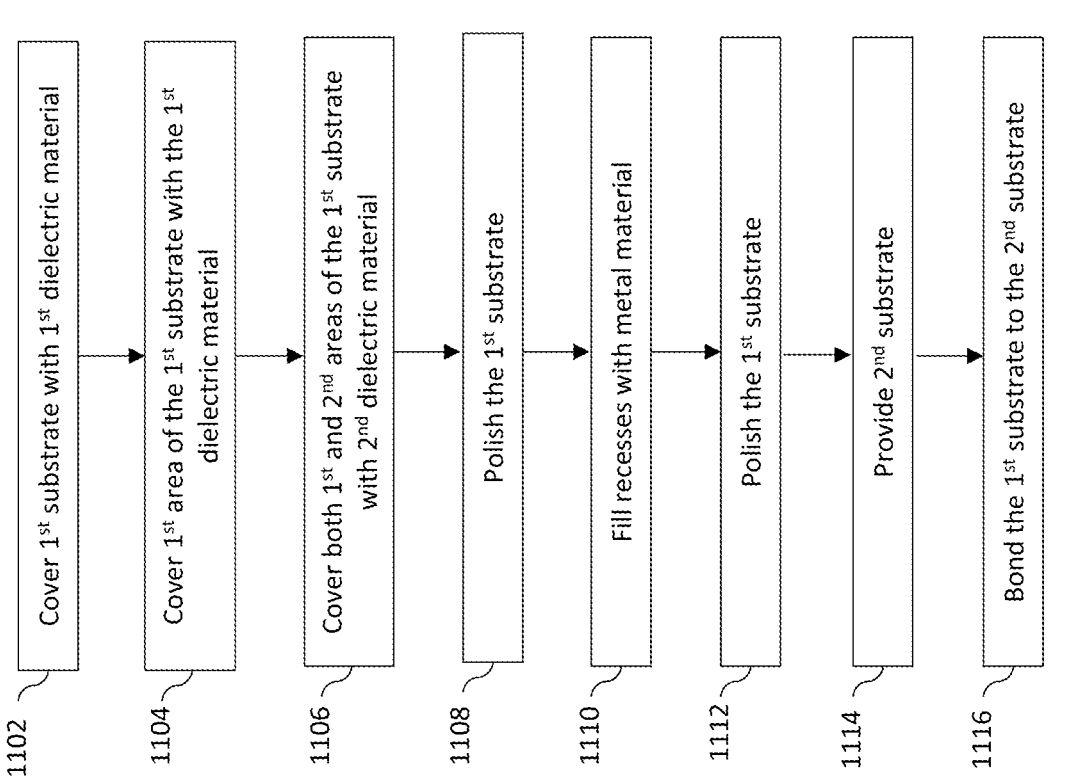

FIG. 11 illustrates a flowchart of another method 1100 for forming a semiconductor device (e.g., package) having at least two coupled (e.g., bonded) wafers, dies, or substrates based on two hybrid bonding layers originally formed over the two substrates. It is noted that the method 1100 is merely an example, and is not intended to limit the present disclosure. Accordingly, it is understood that additional operations may be provided before, during, and after the method 1100 of FIG. 11, and that some other operations may only be briefly described herein.

Similarly, each of the to-be-bonded substrates has at least a first area and a second area that configured as real estate for a number of logic devices and a number of memory cells, respectively, as illustrated in FIG. 2. In some embodiments, the logic devices can operatively serve as at least one of: an I/O circuit, a logic control circuit, a command register (circuit), an address register (circuit), a sequencer (circuit), a row decoder (circuit), or a sensing amplifier (circuit). The memory arrays can each include a plural number of memory cells, each of the memory cells is configured to store data. For example, the memory arrays may each include a dynamic random-access memory (DRAM) array, a static random-access memory (SRAM) array, a resistive random-access memory (RRAM) array, a magnetoresistive random access memory (MRAM) array, a phase change random access memory (PCRAM) array, etc.

Further, operations of the method 1100 may be associated with cross-sectional views of an example semiconductor device 1200 at various fabrication stages as shown in FIGS. 12 to 19, respectively, which will be discussed in further detail below. The semiconductor device 1200 includes at least two substrates, each of which may include a first area and a second area configured to house logic devices and memory cells, respectively, as shown in FIG. 2. It should be understood that the semiconductor device 1200, shown in FIGS. 12 to 19, may include a number of other devices such as inductors, fuses, capacitors, coils, etc., while remaining within the scope of the present disclosure.

Figures 12, 13, 14:
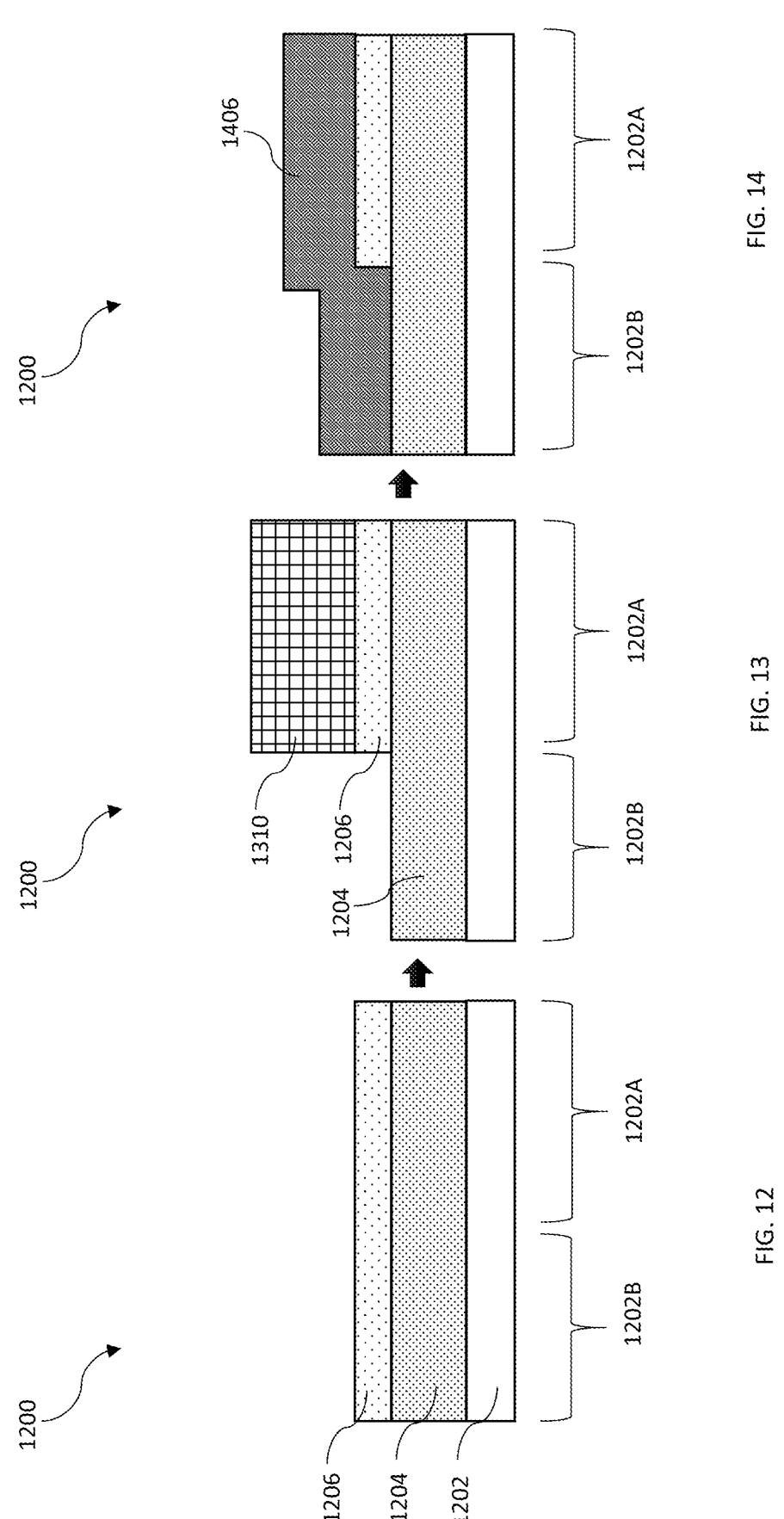
FIGS. 12-19 show cross-sectional views of a device during various fabrication stages of the method of FIG. 11, according to various embodiments.

Corresponding to operation 1102 of FIG. 11, FIG. 12 is a cross-sectional view of the semiconductor device 1200 in which a first substrate 1202 is covered by a first dielectric material 1206 at one of the various stages of fabrication, in accordance with various embodiments of the present disclosure.

The first substrate 1202 may be a semiconductor substrate, such as a bulk semiconductor, a semiconductor-on-insulator (SOI) substrate, or the like, which may be doped (e.g., with a p-type or an n-type dopant) or undoped. In some embodiments, the first substrate 1202 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. For example, the semiconductor material of the first substrate 1202 may include silicon; a compound semiconductor including silicon carbide, gallium arsenic, gallium phosphide, indium phosphide, indium arsenide, and/or indium antimonide; an alloy semiconductor including, GaAsP, AlInAs, AlGaAs, GaInAs, GaInP, and/or GaInAsP; or combinations thereof.

As noted above, the first substrate 1202 includes a first area 1202A and a second area 1202B that are configured to form logic devices (not shown) and memory cells (not shown), respectively. In various embodiments, a number of inter-metal dielectric (IMD) materials 1204 are formed over the logic devices and memory cells, i.e., over both the first area 1202A and second area 1202B. A number of interconnect structures can be formed in the IMD material 1204 where the IMD material 1204 is configured to electrically isolate neighboring ones of the interconnect structures, which will be discussed below. The IMD material 1204 can be formed of one or more dielectric materials such as, for example, $SiO_2$. Over the IMD material 1204, the first dielectric material 1206 is formed. At the current fabrication stage, the first dielectric material 1206 may be formed over both the first area 1202A and second area 1202B. In various embodiments, the first dielectric material 1206 may include SiCN or other suitable materials that can be used to mitigate copper diffusion (when forming interconnect structures) and/or lower RC delay (between neighboring interconnect structures).

Corresponding to operation 1104 of FIG. 11, FIG. 13 is a cross-sectional view of the semiconductor device 1200 in which the first dielectric material 1206 is patterned to cover only the first area 1202A at one of the various stages of fabrication, in accordance with various embodiments of the present disclosure.

In various embodiments, the first dielectric material 1206 is patterned using lithography. For example, a patternable layer (e.g., a photoresist layer) 1210 is formed over the first area 1202A of the first dielectric material 1206, followed by an etching process to remove the uncovered portion of the first dielectric material 1206 (i.e., the first dielectric material 1206 in the second area 1202B). Consequently, a portion of the IMD material 1204 in the second area 1202B can be exposed, as shown in FIG. 13.

Corresponding to operation 1106 of FIG. 11, FIG. 14 is a cross-sectional view of the semiconductor device 1200 in which a second dielectric material 1406 is formed to cover both the first area 1202A and second area 1202B at one of the various stages of fabrication, in accordance with various embodiments of the present disclosure.

Upon the portion of the IMD material 1204 in the second area 1202B being exposed, the second dielectric material 1406 is formed to universally cover both the first area 1202A and second area 1202B. In various embodiments, the second dielectric material 1406 may be different from the first dielectric material 1206. The second dielectric material 1406 may be configured to provide strong bonding strength with another substrate, while the first dielectric material 1206 may be configured to mitigate copper diffusion and/or reduce RC delay. For example, the second dielectric material 1406 may include $SiO_2$ and/or high-k dielectric materials.

Figures 15, 16, 17:
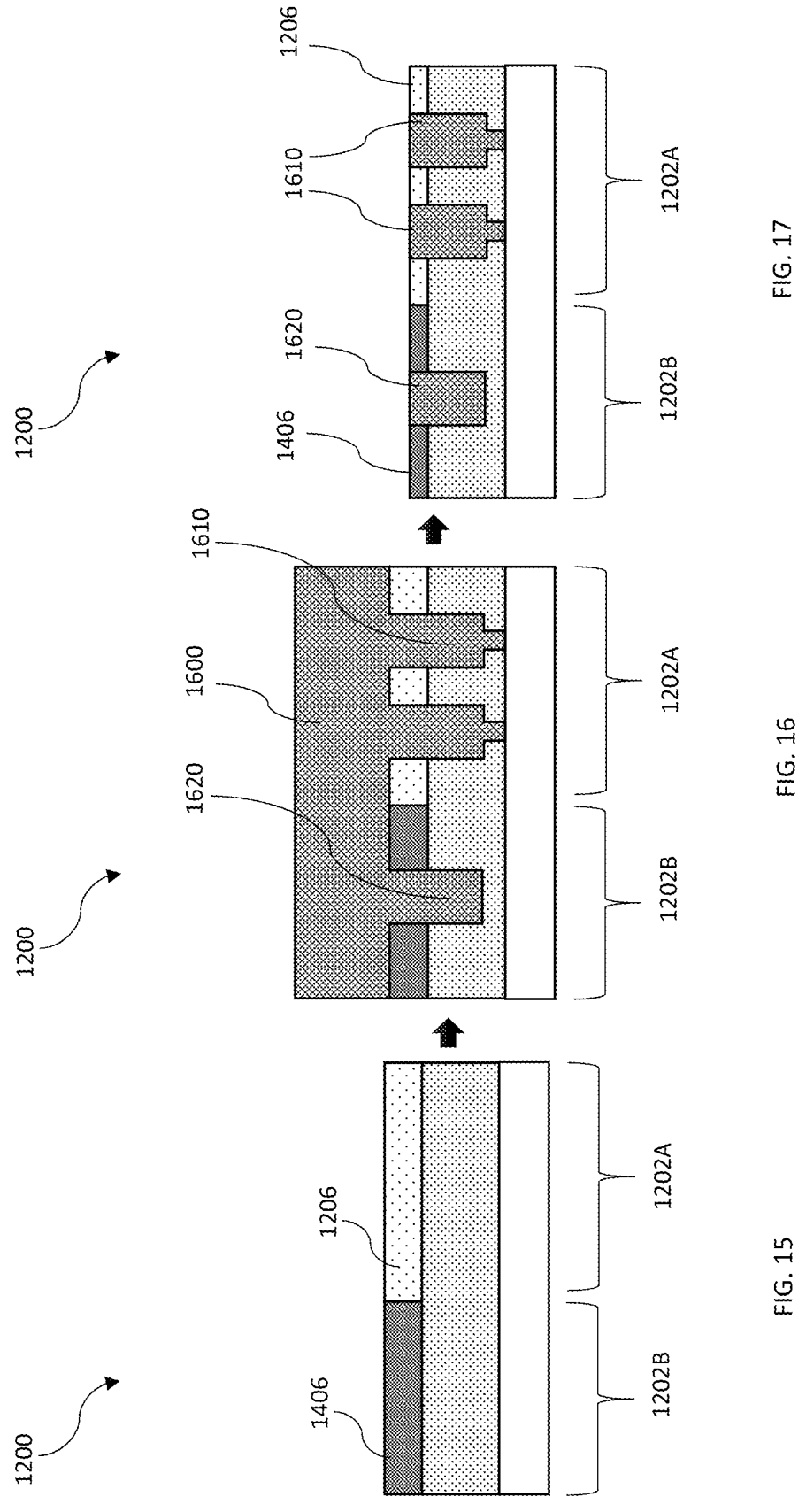

Corresponding to operation 1108 of FIG. 11, FIG. 15 is a cross-sectional view of the semiconductor device 1200 in which the first substrate 1202 is polished at one of the various stages of fabrication, in accordance with various embodiments of the present disclosure.

In various embodiments, after depositing the second dielectric material 1406, a chemical mechanical polishing (CMP) process is performed to remove at least a portion of the second dielectric material 1406 disposed in the first area 1202A until a coplanar surface, which is shared by the first dielectric material 1206 and the second dielectric material 1406, is formed. As such, the first area 1202A may only be covered by the first dielectric material 1206, and the second area 1202B may only be covered by the second dielectric material 1406.

Corresponding to operation 1110 of FIG. 11, FIG. 16 is a cross-sectional view of the semiconductor device 1200 in which a metal material 1600 is formed to fill first recesses and second recesses that are formed in the first area 1202A and second area 1202B, respectively, at one of the various stages of fabrication, in accordance with various embodiments of the present disclosure.

After covering the first area 1202A and second area 1202B with the first dielectric material 1206 and second dielectric material 1406, respectively, a number of first recesses are formed in the IMD material 1204 and the first dielectric material 1206; and a number of second recesses are formed in the IMD material 1204 and the second dielectric material 1406. In various embodiments, the first recesses may extend through the first dielectric material 1206 and the IMD material 1204 to reach (e.g., be in electrical contact with) the logic devices formed in the first area 1202A. On the other hand, the second recesses may extend through the second dielectric material 1406 and the IMD material 1204, which may not necessarily reach (e.g., be in electrical contact with) the memory cells formed in the second area 1202B. Next, the first recesses and second recesses may be filled with the metal material 1610, which forms a number of interconnect structures. For example, a number of first interconnect structures 1610 can be formed in the first area 1202A, and a number of second interconnect structures 1620 can be formed in the second area 1202B. The first interconnect structures 1610 may be connected to the logic devices formed in the first area 1202A, while the second interconnect structures 1620 may not be necessarily connected to the memory cells formed in the second area 1202B. The metal material 1600 may include at least one of Cu, Al, W, Ti, TiN, Ta, TaN, or combinations thereof.

Corresponding to operation 1112 of FIG. 11, FIG. 17 is a cross-sectional view of the semiconductor device 1200 in which a polishing process is performed on the workpiece at one of the various stages of fabrication, in accordance with various embodiments of the present disclosure.

After filling the first and second recesses with the metal material 1600, a chemical mechanical polishing (CMP) process is performed to remove at least the excessive metal material 1600 until a coplanar surface, which is shared by the first interconnect structures 1610, the first dielectric material 1206, the second interconnect structures 1620, and the second dielectric material 1406, is formed. As a result, a first bonding layer, having a top surface shared by a mixture of polished surfaces of the first interconnect structures 1610 and the first dielectric material 1206, can be formed in the first area 1202A, and a second bonding layer, having a top surface shared by a mixture of polished surfaces of the second interconnect structures 1620 and the second dielectric material 1506, can be formed in the second area 1202B, according to various embodiments of the present disclosure. The first bonding layer, formed in the first area 1202A of the first substrate 1202, may at least include the first dielectric material 1206; and the second bonding layer, formed in the second area 1202B of the first substrate 1202, may at least include the second dielectric material 1406.

Figure 18:
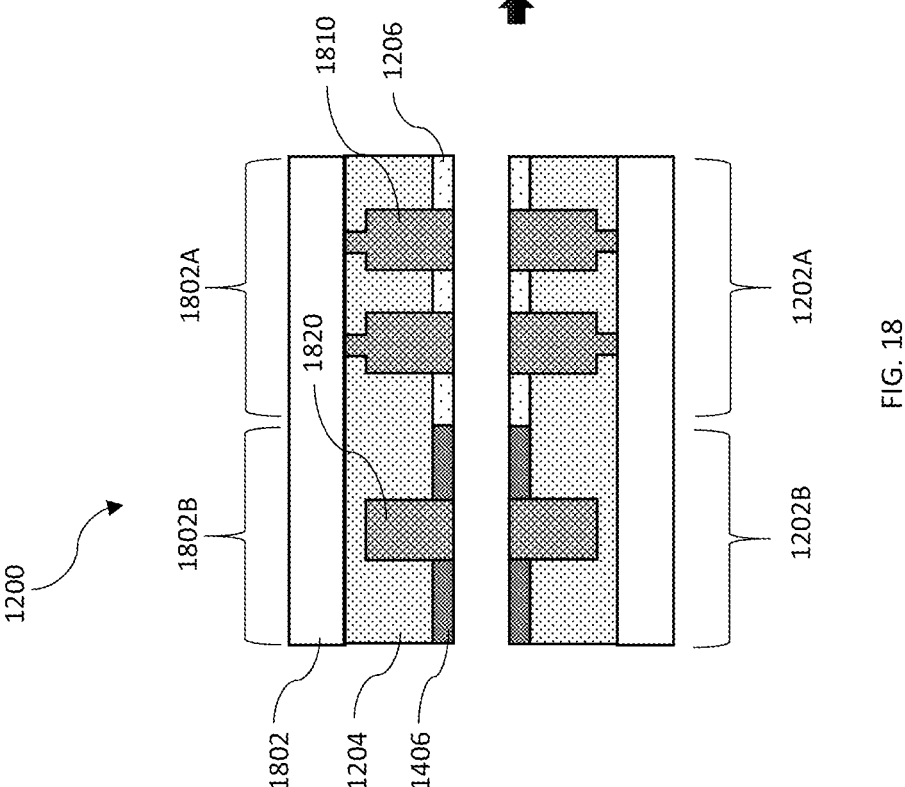

Corresponding to operation 1114 of FIG. 11, FIG. 18 is a cross-sectional view of the semiconductor device 1200 in which a second substrate 1802 is provided at one of the various stages of fabrication, in accordance with various embodiments of the present disclosure.

The second substrate 1802 may be prepared similarly to the first substrate 1202, according to operations 1102 to 1112 of the method 1100 (FIG. 11). As such, the second substrate 1802 may also include a first area 1802A and a second area 1802B. In the first area 1802A, a number of first interconnect structures 1810 are formed to extend through the IMD material 1204 and the first dielectric material 1206; and, in the second area 1202B, a number of second interconnect structures 1820 are formed to extend through the IMD material 1204 and the second dielectric material 1406. In other words, the second substrate 1802 may also include a first bonding layer, having a top surface shared by a mixture of polished surfaces of the first interconnect structures 1810 and the first dielectric material 1206, in the first area 1802A, and a second bonding layer, having a top surface shared by a mixture of polished surfaces of the second interconnect structures 1820 and the second dielectric material 1406, in the second area 1802B, according to various embodiments of the present disclosure. The first bonding layer, formed in the first area 1802A of the second substrate 1802, may at least include the first dielectric material 1206; and the second bonding layer, formed in the second area 1802B of the second substrate 1802, may at least include the second dielectric material 1406.

Figure 19:
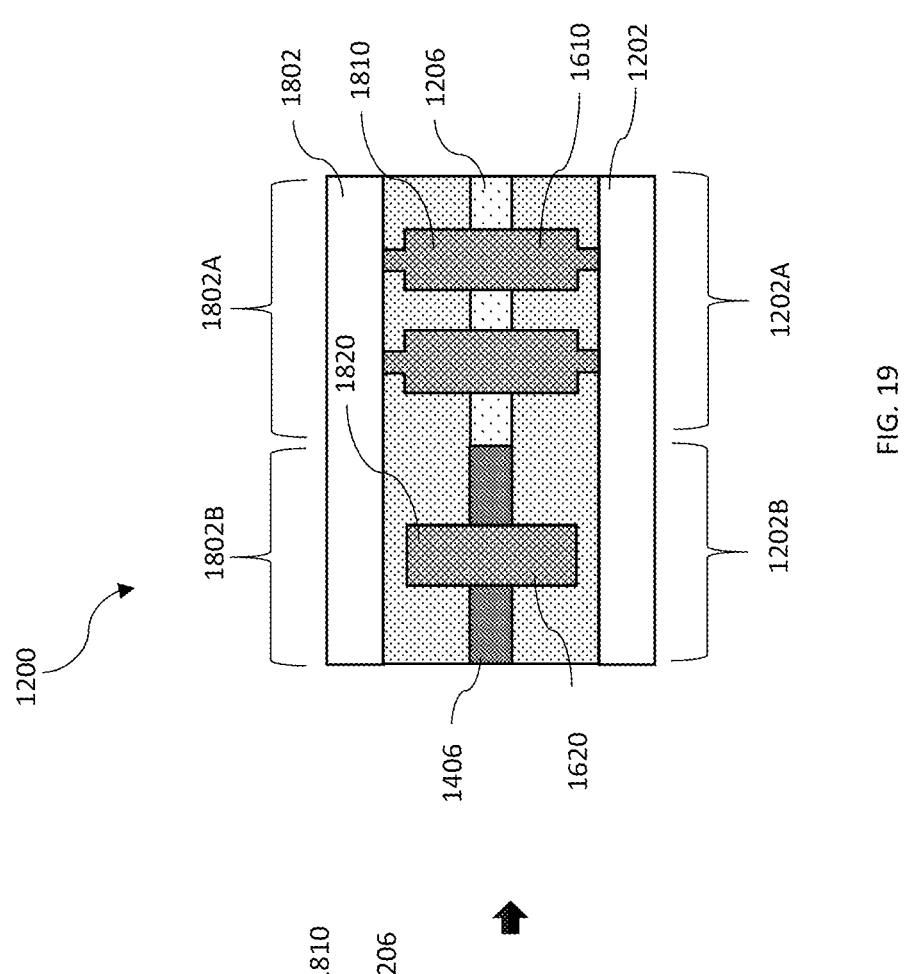

Corresponding to operation 1116 of FIG. 11, FIG. 19 is a cross-sectional view of the semiconductor device 1200 in which the first substrate 1202 and the second substrate 1802 are bonded to each other through the respective first bonding layers and second bonding layers at one of the various stages of fabrication, in accordance with various embodiments of the present disclosure.

In various embodiments, the first substrate 1202 and the second substrate 1802 are bonded together using a hybrid bonding process by coupling a top surface of the first bonding layer of the first substrate 1202 to a top surface of the first bonding layer of the second substrate 1802, and by coupling a top surface of the second bonding layer of the first substrate 1202 to a top surface of the second bonding layer of the second substrate 1802. As such, the respective first areas 1202A and 1802A may be bonded to each other through the first bonding layers (essentially comprised of the first dielectric material 1206), and the respective second areas 1202B and 1202B may be bonded to each other through the second bonding layers (essentially comprised of the second dielectric material 1406). For example, the first interconnect structures 1610 of the first semiconductor substrate 1202 are aligned with the first interconnect structures 1810 of the second semiconductor substrate 1802, and the second interconnect structures 1620 of the first semiconductor substrate 1202 are aligned with the second interconnect structures 1820 of the second semiconductor substrate 1802. The alignment of the first and second semiconductor substrates 1202 and 1802 may be achieved using optical sensing, as an example.

After the alignment process, the first and second semiconductor substrates, 1202 and 1802, are hybrid bonded together by applying pressure and heat. The term "hybrid" refers to the formation of at least two different types of bonds using a single bonding process, rather than forming only one type of the bonds, as is the practice in other types of wafer-to-wafer or die-to-die bonding processes, for example. As illustrated in the example of FIG. 19, a first type of bonds may be present between the first interconnect structures 1610 and 1810, and between the second interconnect structures 1620 and 1820; a second type of bonds may be present between the respective first dielectric materials 1206 of the first and second substrates; and a third type of bonds may be present between the respective second dielectric materials 1406 of the first and second substrates. Consequently, a (e.g., central) portion of collective sidewalls of the bonded first interconnect structures 1610 and 1810 may be surrounded by the first bonding layer (formed at least of the first dielectric material 1206); and a (e.g., central) portion of collective sidewalls of the bonded first interconnect structures 1620 and 1820 may be surrounded by the second bonding layer (formed at least of the second dielectric material 1406).

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
a first substrate including a first area and a second area;
a first dielectric layer disposed on the first substrate;
a first bonding layer comprising a first dielectric material that bonds the first area to a third area of a second substrate;
a first interconnect structure extending through the first bonding layer and into the first dielectric layer, and having a first upper surface not overlaid by the first bonding layer;
a second interconnect structure extending through a second bonding layer and into the first dielectric layer, and having a second upper surface not overlaid by the second bonding layer;
the second substrate including the third area and a fourth area;
a second dielectric layer disposed on the second substrate;
a third interconnect structure extending through the first bonding layer and into the second dielectric layer, and having a third upper surface not overlaid by the first bonding layer;
a fourth interconnect structure extending through the second bonding layer and into the second dielectric layer, and having a fourth upper surface not overlaid by the second bonding layer; and
the second bonding layer comprising a second dielectric material that bonds the second area to the fourth area, wherein the first dielectric material is different from the second dielectric material.

2. The semiconductor device of claim 1, wherein the first interconnect structure contacts the third interconnect structure, with the first upper surface and the third upper surface in contact with each other, and the second interconnect structure contacts the fourth interconnect structure, with the second upper surface and the fourth upper surface in contact with each other.

3. The semiconductor device of claim 2, wherein the first bonding layer is around a portion of a collective sidewall of the contacted first and third interconnect structures.

4. The semiconductor device of claim 2, wherein the second bonding layer is around a portion of a collective sidewall of the contacted second and fourth interconnect structures.

5. The semiconductor device of claim 2, wherein the first substrate includes a plurality of first logic devices in the first area and a plurality of first memory cells in the second area, respectively.

6. The semiconductor device of claim 5, wherein the second substrate includes a plurality of second logic devices in the third area and a plurality of second memory cells in the fourth area, respectively.

7. The semiconductor device of claim 6, wherein the first interconnect structure is electrically coupled to at least one of the plurality of first logic devices, and the third interconnect structure is electrically coupled to at least one of the plurality of second logic devices.

8. The semiconductor device of claim 6, wherein the second interconnect structure is not electrically coupled to any of the plurality of first memory cells, and the fourth interconnect structure is not electrically coupled to any of the plurality of second memory cells.

9. The semiconductor device of claim 1, wherein the first dielectric material includes silicon carbonitride, and the second dielectric material includes a high-k dielectric.

10. The semiconductor device of claim 1, wherein the first dielectric material includes silicon carbonitride, and the second dielectric material includes silicon oxide.

11. The semiconductor device of claim 1, wherein the first substrate is a first semiconductive wafer and the second substrate is a second semiconductive wafer.

12. A semiconductor device, comprising:
a first substrate including a first interconnect structure and a second interconnect structure in a first area and a second area, respectively;
a second substrate including a third interconnect structure and a fourth interconnect structure in a third area and a fourth area, respectively, wherein the first interconnect structure is in contact with the third interconnect structure and the second interconnect structure is in contact with the fourth interconnect structure;
a first bonding layer comprising a first dielectric material that bonds the first area to the third area; and
a second bonding layer comprising a second dielectric material that bonds the second area to the fourth area, wherein the first dielectric material is different from the second dielectric material, and
wherein the first substrate includes a plurality of first logic devices in the first area and a plurality of first memory cells in the second area, respectively, and the second substrate includes a plurality of second logic devices in the third area and a plurality of second memory cells in the fourth area, respectively.

13. The semiconductor device of claim 12, wherein the first dielectric material includes silicon carbonitride, and the second dielectric material includes a high-k dielectric.

14. The semiconductor device of claim 12, wherein the first dielectric material includes silicon carbonitride, and the second dielectric material includes silicon oxide.

15. The semiconductor device of claim 12, wherein the first interconnect structure is electrically coupled to at least one of the plurality of first logic devices, and the third interconnect structure is electrically coupled to at least one of the plurality of second logic devices, and wherein the second interconnect structure is not electrically coupled to any of the plurality of first memory cells, and the fourth interconnect structure is not electrically coupled to any of the plurality of second memory cells.

16. The semiconductor device of claim 12, wherein the first substrate is a first semiconductive wafer and the second substrate is a second semiconductive wafer.

17. A method for fabricating semiconductor devices, comprising:

provising a first substrate including a first dielectric layer;

overlaying a first area and a second area of the first dielectric layer with a first bonding layer that includes a first dielectric material and a second bonding layer that includes a second dielectric material, respectively;

providing a second substrate including a second dielectric layer;

overlaying a third area and a fourth area of the second dielectric layer with a third bonding layer that includes the first dielectric material and a fourth bonding layer that includes the second dielectric material, respectively; and bonding the first substrate to the second substrate through the first to fourth bonding layers, with the first area coupled to the third area and the second area coupled to the fourth area, respectively, wherein the first dielectric material is different from the second dielectric material.

18. The method of claim 17, wherein the first dielectric material includes silicon carbonitride, and the second dielectric material includes a high-k dielectric or silicon oxide.

19. The method of claim 17, further comprising:

forming, in the first area, a first interconnect structure extending through the first bonding layer and into the first dielectric layer;

forming, in the second area, a second interconnect structure extending through the second bonding layer and into the first dielectric layer;

forming, in the third area, a third interconnect structure extending through the third bonding layer and into the second dielectric layer; and forming, in the fourth area, a fourth interconnect structure extending through the fourth bonding layer and into the second dielectric layer, wherein, after the step of bonding the first substrate to the second substrate, the first interconnect structure is in contact with the third interconnect structure and the second interconnect structure is in contact with the fourth interconnect structure, respectively.

20. The method of claim 17, wherein the first substrate is a first semiconductive wafer and the second substrate is a second semiconductive wafer.

* * * * *